(12) United States Patent
Feng et al.

(10) Patent No.: US 12,365,053 B2
(45) Date of Patent: Jul. 22, 2025

(54) METHOD, DEVICE, AND SYSTEM FOR DETECTING WELDING SPOT QUALITY ABNORMALITIES BASED ON DEEP LEARNING

(71) Applicant: Tianjin Sunke Digital control technology Co. Ltd., Tianjin (CN)

(72) Inventors: Eugene Feng, Tianjin (CN); Yongzhi Zhang, Tianjin (CN); Lanmin Nie, Tianjin (CN)

(73) Assignee: Tianjin Sunke Digital control technology Co. Ltd., Tianjin (CN)

( * ) Notice: Subject to any disclaimer, the term of this patent is extended or adjusted under 35 U.S.C. 154(b) by 776 days.

(21) Appl. No.: 17/677,056

(22) Filed: Feb. 22, 2022

(65) Prior Publication Data

US 2023/0087105 A1    Mar. 23, 2023

(30) Foreign Application Priority Data

Sep. 18, 2021   (CN) .......................... 202111098723.6

(51) Int. Cl.
*B23K 31/12*     (2006.01)
*B23K 31/00*     (2006.01)
(Continued)

(52) U.S. Cl.
CPC .......... *B23K 31/125* (2013.01); *B23K 31/006* (2013.01); *G06F 30/27* (2020.01); *G06N 3/045* (2023.01); *B23K 11/11* (2013.01)

(58) Field of Classification Search
CPC .... B23K 31/125; B23K 31/006; B23K 11/11; B23K 11/25; G06F 30/27; G06N 3/045; G06N 3/088; G06N 3/08; Y02P 90/30
See application file for complete search history.

(56) References Cited

U.S. PATENT DOCUMENTS 12,093,019 B2 * 9/2024 Wang ................ G05B 19/4099
2003/0234239 A1   12/2003 Lee
(Continued)

FOREIGN PATENT DOCUMENTS

CN        109598012 A      4/2019
CN        109714340 A  *   5/2019  ............. H04L 29/06
(Continued)

OTHER PUBLICATIONS

Du Fu-Zhou, Tang Xioa-Qing, Multivariate Quality Control and Diagnosis Based on the Principal Component Analysis, Feb. 11, 2006, vol. 28 No. 8, Aug. 2006, China Academic Journal Electronic Publishing House, Beijing, China; plus a machine translation thereof.
(Continued)

*Primary Examiner* — Chuen-Meei Gan
(74) *Attorney, Agent, or Firm* — Sisson & Banyas, Attorneys at Law, LLC; Edwin A. Sisson

(57) ABSTRACT

The present application relates to a method, device, and system for detecting welding spot quality abnormalities based on deep learning. The method includes: acquiring a dynamic welding parameter in a welding process corresponding to any target welding spot; inputting the dynamic welding parameter into a pre-trained dynamic welding parameter simulation model for simulation, and acquiring a welding simulation parameter output by the dynamic welding parameter simulation model; determining a deviation of the dynamic welding parameter from the welding simulation parameter, and determining that the target welding spot is an abnormal welding spot when the deviation is greater than a preset threshold. The solution of the present application can reduce the frequency of manual tearing down and batches for abnormality detection, which has a faster abnormality detection speed and may cover all welding spots.

8 Claims, 2 Drawing Sheets

(51) Int. Cl.
*G06F 30/27* (2020.01)
*G06N 3/045* (2023.01)
*B23K 11/11* (2006.01)

(56) References Cited

U.S. PATENT DOCUMENTS

| | | |
|---|---|---|
| 2013/0248505 A1 | 9/2013 | Anayama |
| 2021/0073968 A1 | 3/2021 | Liu |
| 2021/0201089 A1 | 7/2021 | Lin |

FOREIGN PATENT DOCUMENTS

| CN | 110434443 A | | 11/2019 | | |
| CN | 111069736 A | * | 4/2020 | ............ | B23K 9/095 |
| CN | 111084621 A | | 5/2020 | | |
| CN | 111915015 A | | 11/2020 | | |
| CN | 112149757 A | | 12/2020 | | |
| CN | 112650146 A | | 4/2021 | | |
| CN | 113210911 A | * | 8/2021 | ............ | B23K 31/00 |
| CN | 113255778 A | * | 8/2021 | ............ | G06K 9/62 |
| CN | 113360337 A | | 9/2021 | | |
| CN | 114402360 A | | 4/2022 | | |
| JP | 5-185227 A | | 7/1993 | | |
| JP | 2013-510725 A | | 3/2013 | | |
| JP | 3197100 U | | 4/2015 | | |
| WO | 2012050108 A1 | | 4/2012 | | |
| WO | 2018072326 A1 | | 4/2018 | | |
| WO | 2020250247 A2 | | 12/2020 | | |
| WO | 2021056724 A1 | | 4/2021 | | |

OTHER PUBLICATIONS

Liao Qing Fu, Wu Li Ming, Deng Yao Hua, The Improved RBF Network Approach to LED Solder Joints Inspection Based on SVM-DDA, Fund Projects Showing Design Application, Mar. 29, 2013, pp. 37-39, www.eepw.com.cn, Wan Chong, editor, Guangzhou, Guangdong, China; plus a machine translation thereof.

* cited by examiner

METHOD, DEVICE, AND SYSTEM FOR DETECTING WELDING SPOT QUALITY ABNORMALITIES BASED ON DEEP LEARNING

PRIORITIES AND CROSS REFERENCES

This Application claim the benefit and priority of Chinese Patent Application No. 202111098723.6 filed on 18 Sep. 2021, the teachings of which are incorporated by reference herein in their entirety as part of the present application.

TECHNICAL FIELD

The present application relates to the technical field of welding quality detection, and in particular to a method, device, and system for detecting welding spot quality abnormalities based on deep learning.

BACKGROUND

Resistance welding has the benefits of low cost, high efficiency and strong adaptability. Therefore, it is widely used in mass production. In mass production, the number of welding spots formed by resistance welding is relatively large. For example, there will be more than 4000 welding spots in the body-in-white welding of an automobile, and at present a common quality detection basically depends on the way of sampling by manually tearing down to check the quality of resistance welding.

However, sampling by manual tearing down cannot cover all the welding spots, and requires labor, which is time-consuming and leads to higher detection costs.

SUMMARY

In order to overcome the above-mentioned problems, namely sampling by manual tearing down, cannot cover all the welding spots and requires labor, which is time consuming and leads to higher detection cost, the present application provides a method, device, and system for detecting welding spot quality abnormalities based on deep learning.

According to a first aspect of the present application, a method for detecting welding spot quality abnormalities based on deep learning is provided, including:
acquiring dynamic welding parameters in a welding process corresponding to a target welding spot;
inputting the dynamic welding parameter into a pre-trained dynamic welding parameter simulation model for simulation, and acquiring a welding simulation parameter output by the dynamic welding parameter simulation model; and
determining a deviation of the dynamic welding parameters from the welding simulation parameter, and when the deviation is greater than a preset threshold, determining if the target welding spot is an abnormal welding spot.

Optionally, the dynamic welding parameter simulation model may be a deep learning auto-encoder model; and
said inputting the dynamic welding parameters into a pre-trained dynamic welding parameter simulation model for simulation and acquiring a welding simulation parameter output by the dynamic welding parameter simulation model may include:
inputting the dynamic welding parameters into the pre-trained deep learning auto-encoder model for reconstruction thereof, and acquiring the welding simulation parameter output by the auto-encoder model.

Optionally, said inputting the dynamic welding parameter input into the pre-trained deep learning auto-encoder model for reconstruction thereof and acquiring the welding simulation parameter output by the auto-encoder model may include:
inputting the dynamic welding parameter into an encoder layer of the pre-trained deep learning auto-encoder model for dimensionality reduction mapping, and acquiring a target dimensionality parameter output by the encoder layer; and
inputting the target dimensionality parameter into a decoder layer of the pre-trained deep learning auto-encoder model for reconstruction mapping, and acquiring the welding simulation parameter output by the decoder layer.

Optionally, the dynamic welding parameter simulation model may be a sequence-to-sequence model; and
said inputting the dynamic welding parameter into a pre-trained dynamic welding parameter simulation model for simulation and acquiring a welding simulation parameter output by the dynamic welding parameter simulation model may include:
inputting the dynamic welding parameter into the pre-trained sequence-to-sequence model for prediction, and acquiring the welding simulation parameter output by the sequence-to-sequence model.

Optionally, said acquiring the dynamic welding parameter in the welding process corresponding to a target welding spot may include:
when welding any target welding spot, acquiring the dynamic welding parameter in the welding process at intervals of a preset duration.

Optionally, the method may further includes
if the deviation is less than or equal to the preset threshold, storing the acquired dynamic welding parameter of the target welding spot in a target storage area; and
acquiring the stored dynamic welding parameter from the target storage area, and updating and training the dynamic welding parameter simulation model by using the stored dynamic welding parameter as a training sample.

Optionally, said updating and training the dynamic welding parameter simulation model by using the stored dynamic welding parameter as a training sample may include:
for any set of training samples, inputting the training samples into the dynamic welding parameter simulation model for simulation, and acquiring simulation sample data output by the dynamic welding parameter simulation model; and
adjusting model parameters of the dynamic welding parameter simulation model based on the deviation of the simulation sample data from the training sample, so as to realize the updating and training of the dynamic welding parameter simulation model.

According to a second aspect of the present application, a device for detecting welding spot quality abnormalities based on deep learning is provided, including:
an acquiring module configured to acquire a dynamic welding parameter in a welding process corresponding to any target welding spot;
a simulating module configured to input the dynamic welding parameter into a pre-trained dynamic welding parameter simulation model for simulation, and acquire a welding simulation parameter output by the dynamic welding parameter simulation model;

an abnormality determining module configured to determine a deviation of the dynamic welding parameter from the welding simulation parameter, and to determine that the target welding spot is an abnormal welding spot when the deviation is greater than a preset threshold.

According to a third aspect of the present application, a system for detecting welding spot quality abnormalities based on deep learning is provided, including:

a dynamic welding parameter collection device which acquires a dynamic welding parameter in a process of welding a target welding spot by a welding device, and sends the dynamic welding parameter to the welding spot data display control device;

a welding spot quality abnormality detecting device which is connected to the welding spot data display control device, receives the dynamic welding parameter sent by the welding spot data display control device, and determines whether the target welding spot is an abnormal welding spot based on the dynamic welding parameter according to the method as defined in the first aspect of the present application; and a welding spot data display control device which displays the dynamic welding parameter, and sends the dynamic welding parameter to the welding spot quality abnormality detecting device.

According to a fourth aspect of the present application, a storage medium storing one or more programs is provided, wherein the one or more programs, when being executed, carry out the method as defined in the first aspect of the present application.

The solution provided in the present application may have the following beneficial effects. The method is feature by comprising a step of acquiring a dynamic welding parameter in a welding process corresponding to a target welding spot, a step of inputting the dynamic welding parameter into a pre-trained dynamic welding parameter simulation model for simulation, and acquiring a welding simulation parameter output by the dynamic welding parameter simulation model, and a step of determining a deviation of the dynamic welding parameter from the welding simulation parameter, then determining that the target welding spot is an abnormal welding spot when the deviation is greater than a preset threshold. Accordingly, since a dynamic welding parameter in a welding process can directly reflect the welding quality, a pre-trained dynamic welding parameter simulation model is adopted to perform simulation based on the acquired dynamic welding parameter to acquire a welding simulation parameter. A deviation of the dynamic welding parameter from the welding simulation parameter greater than a preset threshold indicates that the target welding spot in the welding process corresponding to the dynamic welding parameter is an abnormal welding spot. As a result, the solution of the present application can reduce the frequency of manual tearing down and batches for abnormality detection, which provides a faster abnormality detection and can cover all welding spots.

It should be understood that the above general description and the following detailed description are only exemplary and explanatory, and cannot limit the scope of the present application.

BRIEF DESCRIPTION OF THE DRAWINGS

The drawings are incorporated into the description and constitute a part thereof, show embodiments that conform to the present application, and are used together with the description to explain the present application.

DETAILED DESCRIPTION

Figure 1:
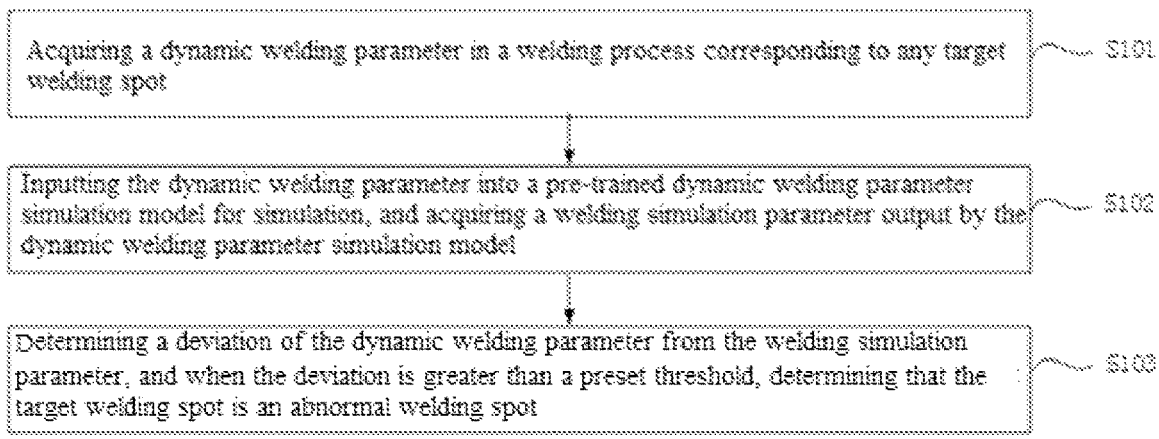
FIG. 1 is a schematic flowchart of a method for detecting welding spot quality abnormalities based on deep learning according to an embodiment of the present application.

The exemplary embodiments described in the drawings will be described in detail below. Unless otherwise indicated, the same numbers in different drawings indicate the same or similar elements. The implementations described in the following exemplary embodiments do not represent all implementations consistent with the present application. On the contrary, they are merely examples of devices and methods consistent with some aspects of the present application as detailed in the appended claims.

FIG. 1 is a schematic flowchart of a method for detecting welding spot quality abnormalities based on deep learning according to an embodiment of the present application. As shown in FIG. 1, a method for detecting welding spot quality abnormalities based on deep learning in this embodiment may include the following steps.

In step S101, dynamic welding parameters in a welding process corresponding to any target welding spot are acquired.

In this step, the welding process may be implemented by welding robots, welding machine tools or other equipment, and the dynamic welding parameters corresponding to different implementation subjects may be different. Taking the welding robot as an example, welding tongs are installed on an arm of the welding robot, and a welding controller is set to control the welding process. When any target welding spot is welded, the dynamic welding parameter in the welding process is acquired at intervals of a preset duration. The dynamic welding parameter may include welding current, welding voltage, resistance, and power.

In an example, the welding controller may control the current in the welding process in different ways, such as constant phase angle, constant current, or self-adaptation. Constant phase angle means that the on time of each welding cycle is a fixed value. Constant current means that the welding controller guarantees a constant welding current regardless of load and power supply changes. Self-adaptation means that since the electrical characteristics of material changes with the mechanical characteristics of the material during the welding process, the welding controller will adjust the control current according to these changes.

Regardless of which of the control methods is used, the welding controller records the welding current changes in the process after the welding is energized, calculates a root mean square value thereof, and then uses all current values and the calculated current root mean square value as the welding current in the dynamic welding parameter.

In addition, for the welding voltage, a voltage detection wire may be installed on the welding tongs to acquire the welding voltage during the welding process, including voltage values formed by the welding tong voltage and the constantly changing welding core resistance. The welding controller records the voltage changes during the welding process after the welding is energized and calculates a root mean square value thereof, and then uses all voltage values and the calculated root mean square value as the welding voltage in the dynamic welding parameter.

The resistance may be calculated from the acquired welding voltage and welding current. Specifically, a resistance value may be calculated from the welding voltage and welding current detected simultaneously. The welding controller records the resistance changes during the welding process after the welding is energized and calculates a root mean square value thereof, and then uses all resistance values and the calculated resistance root mean square value as the resistance in the dynamic welding parameter.

The power may be calculated from the acquired welding voltage and welding current. Specifically, a power value is calculated from the welding voltage and welding current detected simultaneously. The welding controller records the power changes during the welding process after the welding is energized and calculates a root mean square value thereof, and then uses all power values and the calculated power root mean square value as the power in the dynamic welding parameter.

It should be noted that the aforementioned preset duration may be in milliseconds as a unit. The acquired dynamic welding parameters may form a welding process curve with time as a first axis and dynamic welding parameter as a second axis. Each target welding spot will form a welding process curve. This curve may be more conducive to the simulation of the dynamic welding parameter in the following steps.

In step S102, the dynamic welding parameter is input into a pre-trained dynamic welding parameter simulation model for simulation, and a welding simulation parameter output by the dynamic welding parameter simulation model is acquired.

In this step, the dynamic welding parameter simulation model is a model for obtaining a set of welding simulation parameters by simulating actual dynamic welding parameters. There may be many simulation methods, such as parameter reconstruction and parameter prediction.

Specifically, the dynamic welding parameter simulation model may be a deep learning auto-encoder model, and the dynamic welding parameter is input into the pre-trained deep learning auto-encoder model for reconstruction. The deep learning auto-encoder model may output the welding simulation parameter. In this case, the welding simulation parameter output by the deep learning auto-encoder model may be directly acquired.

The deep learning auto-encoder model may be provided with an encoder layer and a decoder layer. The dynamic welding parameter may be input into the encoder layer of the pre-trained deep learning auto-encoder mode for dimensionality reduction mapping to acquire a target dimensionality parameter. The target dimensionality parameter output by the encoder layer is directly acquired, and then the target dimensionality parameter is input into the decoder layer of the pre-trained deep learning auto-encoder model for reconstruction mapping, and the target dimensionality parameter output by the decoder layer is acquired.

It should be noted that the deep learning auto-encoder model may be trained using a large number of dynamic welding parameter of welding spots, such that the model may learn the dynamic welding parameter encoding and decoding rules of welding spots. During training, minimizing the difference between the welding simulation parameter and the input dynamic welding parameter may be the target for training.

In addition, the dynamic welding parameter simulation model may also be a sequence-to-sequence model. Specifically, the dynamic welding parameter may be input into the pre-trained sequence-to-sequence model for prediction, and then the welding simulation parameter output by the sequence-to-sequence model may be acquired.

Generally, the dynamic welding parameter process curve of the welding spot formed in the previous step may be input to the sequence-to-sequence model as a dynamic welding parameter, and the sequence-to-sequence model is trained by still taking the minimization of the difference between the input and output as the training target.

Whether the auto-encoder model or the sequence-to-sequence model may be constructed by a convolutional neural network (CNN), a recurrent neural network (RNN), a long and short-term memory network (LSTM), and an improved GRU (Gate Recurrent Unit) of RNN.

In step S103, a deviation of the dynamic welding parameter from the welding simulation parameter is determined, and if the deviation is greater than a preset threshold, the target welding spot is determined as an abnormal welding spot.

In this step, the preset threshold may be set according to welding experiments and the simulation results of the dynamic welding parameter simulation model.

In view of that the dynamic welding parameter simulation model is trained using a large number of dynamic welding parameters of welding spots as training samples with a training target of minimizing the difference between input and output, for a normal welding spot, the welding simulation parameter output by the dynamic welding parameter simulation model is very close to the dynamic welding parameter, and the deviation is less than the preset threshold; for an abnormal welding spot, the welding simulation parameter output by the dynamic welding parameter simulation model will be closer to the dynamic welding parameter when the abnormal welding spot is a normal welding spot with a relatively large deviation, i.e., greater than the preset threshold, from the acquired dynamic welding parameter.

Therefore, the solution of the present application can determine whether a target welding spot is an abnormal welding spot by using the dynamic welding parameter.

In order to maintain high accuracy of the dynamic welding parameter simulation model, it may be trained in real time during the detection process. Specifically, if the deviation is less than or equal to the preset threshold, the acquired dynamic welding parameter of the target welding spot is stored in a target storage area; and the stored dynamic welding parameter is acquired from the target storage area, and the dynamic welding parameter simulation model is updated and trained by using the stored dynamic welding parameter as a training sample.

In this embodiment, for any set of training samples, the training samples may be input into the dynamic welding parameter simulation model for simulation, and simulation sample data output by the dynamic welding parameter simulation model may be acquired; and model parameters of the dynamic welding parameter simulation model may be adjusted based on a deviation of the simulation sample data from the training sample to update and train the dynamic welding parameter simulation model.

In this embodiment, a dynamic welding parameter in a welding process corresponding to any target welding spot is acquired, and the dynamic welding parameter is input into a pre-trained dynamic welding parameter simulation model for simulation. A welding simulation parameter output by the dynamic welding parameter simulation model is acquired, and a deviation of the dynamic welding parameter from the welding simulation parameter is determined. In the case where the deviation is greater than a preset threshold, the target welding spot is determined as an abnormal welding spot. Since the dynamic welding parameter in the welding process may directly reflect the welding quality, the pre-trained dynamic welding parameter simulation model is adopted for simulation based on the acquired dynamic welding parameter to obtain the welding simulation parameter. If the deviation of the dynamic welding parameter from the welding simulation parameter is greater than the preset threshold, it means that the target welding spot welded by the welding process corresponding to the dynamic welding parameter is an abnormal welding spot. Based on this, the solution of the present application gets rid of manual tearing down and batches abnormality detection, which has a faster abnormality detection speed and may cover all the welding spots.

Figure 2:
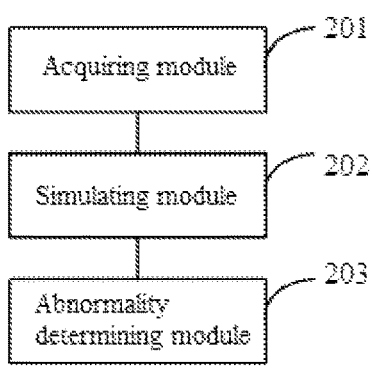
FIG. 2 is a schematic structural diagram of a device for detecting welding spot quality abnormalities based on deep learning according to another embodiment of the present application.

FIG. 2 is a schematic structural diagram of a device for detecting welding spot quality abnormalities based on deep learning according to another embodiment of the present application. As shown in FIG. 2, a device for detecting welding spot quality abnormalities based on deep learning in this embodiment may include an acquiring module 201, a simulating module 202 and an abnormality determining module 203.

The acquiring module 201 is configured to acquire a dynamic welding parameter in a welding process corresponding to any target welding spot.

The simulating module 202 is configured to input the dynamic welding parameter into a pre-trained dynamic welding parameter simulation model for simulation, and acquire a welding simulation parameter output by the dynamic welding parameter simulation model.

The abnormality determining module 203 is configured to determine a deviation of the dynamic welding parameter from the welding simulation parameter, and determine that the target welding spot is an abnormal welding spot when the deviation is greater than a preset threshold.

In this embodiment, the acquiring module 201 acquires a dynamic welding parameter in a welding process corresponding to any target welding spot. The simulating module 202 inputs the dynamic welding parameter into a pre-trained dynamic welding parameter simulation model for simulation, and acquires a welding simulation parameter output by the dynamic welding parameter simulation model. The abnormality determining module 203 determines a deviation of the dynamic welding parameter from the welding simulation parameter, and when the deviation is greater than a preset threshold, determines that the target welding spot is an abnormal welding spot. Since a dynamic welding parameter in a welding process can directly reflect the welding quality, a pre-trained dynamic welding parameter simulation model is adopted to perform simulation based on the acquired dynamic welding parameter to acquire a welding simulation parameter. A deviation of the dynamic welding parameter from the welding simulation parameter greater than a preset threshold indicates that the target welding spot in the welding process corresponding to the dynamic welding parameter is an abnormal welding spot. As a result, the solution of the present application gets rid of manual tearing down and batches abnormality detection, which provides a faster abnormality detection and can cover all welding spots.

Figure 3:
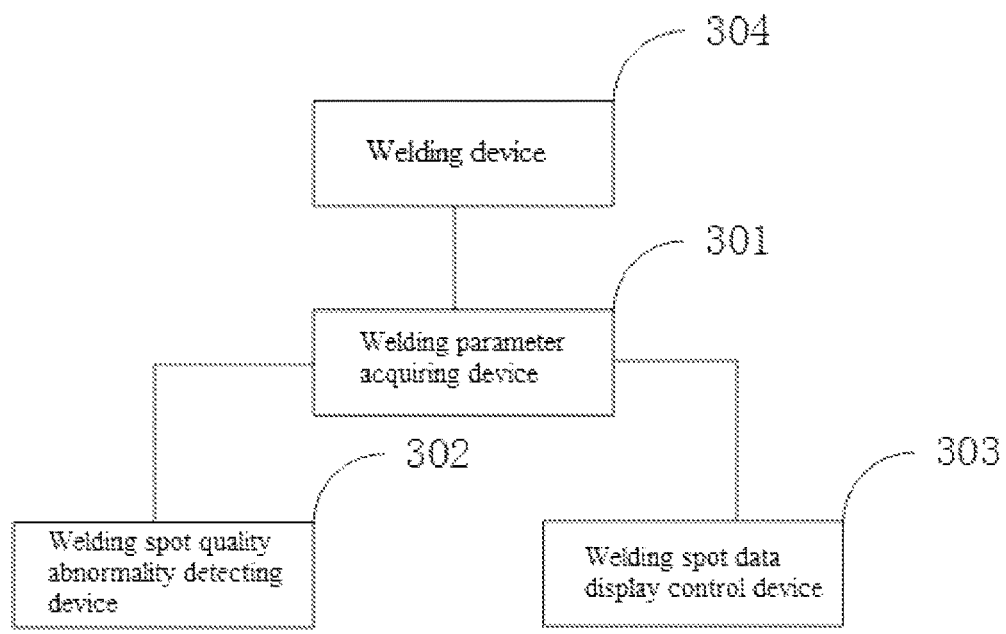
FIG. 3 is a schematic structural diagram of a system for detecting welding spot quality abnormalities based on deep learning according to another embodiment of the present application.

FIG. 3 is a schematic structural diagram of a system for detecting welding spot quality abnormalities based on deep learning according to another embodiment of the present application. As shown in FIG. 3, a system for determining welding spot quality abnormalities based on deep learning in this embodiment may include a dynamic welding parameter acquiring device 301, a welding spot quality abnormality detecting device 302, and a welding spot data display control device 303.

The dynamic welding parameter acquiring device acquires a dynamic welding parameter in a process of welding a target welding spot by a welding device 304, and sends the dynamic welding parameter to the welding spot data display control device.

The welding spot quality abnormality detecting device is connected to the welding spot data display control device, receives the dynamic welding parameter sent by the welding spot data display control device, and determines whether the target welding spot is an abnormal welding spot based on the dynamic welding parameter according to the method provided in the foregoing method embodiment.

The welding spot data display control device displays the dynamic welding parameter, and sends the dynamic welding parameter to the welding spot quality abnormality detecting device.

Figure 4:
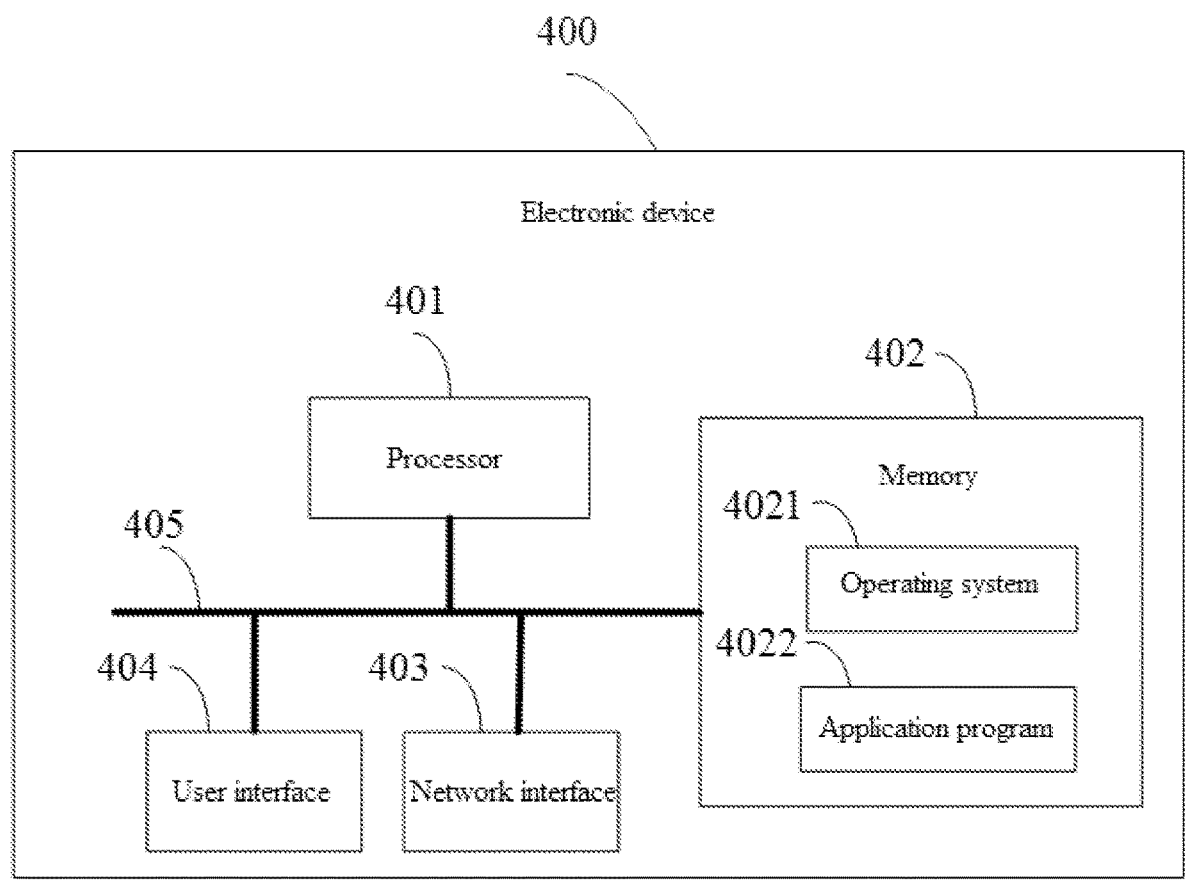
FIG. 4 is a schematic structural diagram of an electronic device according to another embodiment of the present application.

FIG. 4 is a schematic structural diagram of an electronic device according to another embodiment of the present application. As shown in FIG. 4, an electronic device in this embodiment includes at least one processor 401, a memory 402, at least one network interface 403, and other user interfaces 404. The components in the electronic device 400 are coupled together through a bus system 405. The bus system 405 realizes connection and communication between these components. In addition to a data bus, the bus system 405 also includes a power bus, a control bus, and a status signal bus. For clarity of description, various buses are marked as the bus system 405 in FIG. 4.

The user interfaces 404 may include a display, a keyboard, or a pointing device (e.g., a mouse and a trackball), a touch panel, or a touch screen.

It should be understood that the memory 402 in the embodiment of the present invention may be a volatile memory or a non-volatile memory, or may include both volatile and non-volatile memory. Among them, the non-volatile memory may be a read-only memory (ROM), a programmable read-only memory (PROM), an erasable programmable read-only memory (EPROM), an electrically erasable programmable read-only memory (EEPROM) or a flash memory. The volatile memory may be a random access memory (RAM), which is used as an external cache. By way of example rather than restrictive description, many forms of RAMs are available, such as static random access memory (SRAM), dynamic random access memory (DDRAM), synchronous dynamic random access memory (SDRAM), double data rate synchronous dynamic random access memory (DDRSDRAM), enhanced synchronous dynamic random access memory (ESDRAM), synchronous connection dynamic random access memory (SLDRAM), and direct Rambus RAM (DRRAM). The memory 402 described herein is intended to include, but is not limited to, these and any other suitable types of memories.

In some embodiments, the memory 402 stores the following elements, executable units, or data structures, or a subset or superset thereof: an operating system 4021 and a second application program 4022.

Among them, the operating system 4021 includes various system programs, such as a framework layer, a core library layer, and a driver layer, etc. to implement various basic services and process hardware-based tasks. The second application program 4022 includes various second application programs, such as a media player and a browser, to implement various application services. Programs for implementing the method according to the embodiment of the present invention may be included in the second application program 4022.

In the embodiment of the present invention, by calling programs or instructions stored in the memory 402, which may specifically be programs or instructions stored in the second application program 4022, the processor 401 performs the steps of each method embodiment.

The method according to the foregoing embodiment of the present invention may be applied to the processor 401 or implemented by the processor 401. The processor 401 may be an integrated circuit chip with signal processing capabilities. In the implementation process, the steps of the foregoing method may be completed by an integrated logic circuit in the form of hardware or instructions in the form of software in the processor 401. The aforementioned processor 401 may be a general-purpose processor, a digital signal processor (DSP), an application specific integrated circuit (ASIC), a field programmable gate array (FPGA) or other programming logic devices, discrete gates or transistor logic devices, discrete hardware components. The methods, steps, and logical block diagrams in the embodiments of the present invention may be implemented or executed. The general-purpose processor may be a microprocessor or any conventional processor. The steps of the method disclosed in combination with the embodiments of the present invention may be directly embodied as being executed and completed by a hardware decoding processor, or executed and completed by a combination of hardware and software units in the decoding processor. The software unit may be located in a storage medium well-known in the field, such as random access memory, flash memory, read-only memory, programmable read-only memory, or electrically erasable programmable memory, and register. The storage medium is located in the memory 402. The processor 401 reads the information in the memory 402, and completes the steps of the foregoing method in combination with its hardware.

It should be understood that the embodiments described herein may be implemented by hardware, software, firmware, middleware, microcode, or a combination thereof. For hardware implementation, the processing unit may be implemented in one or more application specific integrated circuits (ASIC), digital signal processors (DSP), DSP devices (DSPD), programmable logic devices (PLD), field programmable gate arrays (FPGA), general purpose processors, controllers, microcontrollers, microprocessors, other electronic units for performing the functions of the present application, or a combination thereof.

For software implementation, the technology herein may be realized by units that perform the functions herein. Software codes may be stored in the memory and executed by the processor. The memory may be implemented in the processor or external to the processor.

An embodiment of the present invention also provides a storage medium (computer-readable storage medium). The storage medium stores one or more programs. The storage medium may include a volatile memory such as a random access memory, and may also include a non-volatile memory such as a read-only memory, a flash memory, a hard disk, or a solid-state hard disk. The memory may also include a combination of the foregoing types of memories.

The one or more programs in the storage medium may be executed by one or more processors to implement the above-mentioned method for detecting welding spot quality abnormalities based on deep learning executed on the side of the electronic device.

The processor executes the program for detecting welding spot quality abnormalities based on deep learning stored in the memory to implement the following steps of the method for detecting welding spot quality abnormalities based on deep learning executed on the side of the electronic device:

acquiring a dynamic welding parameter in a welding process corresponding to any target welding spot;

inputting the dynamic welding parameter into a pre-trained dynamic welding parameter simulation model for simulation, and acquiring a welding simulation parameter output by the dynamic welding parameter simulation model; and determining a deviation of the dynamic welding parameter from the welding simulation parameter, and determining that the target welding spot is an abnormal welding spot if the deviation is greater than a preset threshold.

In an alternative embodiment, the dynamic welding parameter simulation model is an auto-encoder model, and said inputting the dynamic welding parameter into a pre-trained dynamic welding parameter simulation model for simulation and acquiring a welding simulation parameter output by the dynamic welding parameter simulation model includes inputting the dynamic welding parameter input into the pre-trained deep learning auto-encoder model for reconstruction thereof, and acquiring the welding simulation parameter output by the auto-encoder model.

Optionally, said inputting the dynamic welding parameter input into the pre-trained deep learning auto-encoder model for reconstruction thereof and acquiring the welding simulation parameter output by the auto-encoder model may include inputting the dynamic welding parameter into an encoder layer of the pre-trained deep learning auto-encoder model for dimensionality reduction mapping, and acquiring a target dimensionality parameter output by the encoder layer; and inputting the target dimensionality parameter into a decoder layer of the pre-trained deep learning auto-encoder model for reconstruction mapping, and acquiring the welding simulation parameter output by the decoder layer.

Optionally, the dynamic welding parameter simulation model may be a sequence-to-sequence model, and said inputting the dynamic welding parameter into a pre-trained dynamic welding parameter simulation model for simulation and acquiring a welding simulation parameter output by the dynamic welding parameter simulation model may include inputting the dynamic welding parameter into the pre-trained sequence-to-sequence model for prediction, and acquiring the welding simulation parameter output by the sequence-to-sequence model.

Optionally, acquiring the dynamic welding parameter in the welding process corresponding to a target welding spot may include acquiring the dynamic welding parameter in the welding process at a preset interval when welding any target welding spot.

Optionally, the method may further include storing the acquired dynamic welding parameter of the target welding spot in a target storage area if the deviation is less than or equal to the preset threshold, and acquiring the stored dynamic welding parameter from the target storage area, and updating and training the dynamic welding parameter simulation model by using the stored dynamic welding parameter as a training sample.

Optionally, said updating and training the dynamic welding parameter simulation model by using the stored dynamic welding parameter as a training sample may include: for any set of training samples, inputting the training samples into the dynamic welding parameter simulation model for simulation, and acquiring simulation sample data output by the dynamic welding parameter simulation model; and adjusting model parameters of the dynamic welding parameter simulation model based on the deviation of the simulation sample data from the training sample, so as to realize the updating and training of the dynamic welding parameter simulation model.

The specific manner in which each module of the device in the foregoing embodiment performs operations has been described in detail in the embodiment of the relevant method, and will not be described in detail here.

It should be understood that the same or similar parts in the above embodiments may be referred to each other. For content not described in detail in some embodiments, reference may be made to the same or similar content in other embodiments.

It should be noted that in the description of the present application, the terms "first", "second", etc. are only used for descriptive purposes, and cannot be understood as indicating or implying relative importance. In addition, in the description of the present application, unless otherwise specified, the meaning of "a plurality of" means at least two.

A flowchart or any process or method description described in other ways should be understood to mean a module, segment, or part of code that includes one or more executable instructions for implementing specific logical functions or steps of the process. The scope of the preferred embodiments of the present application includes additional implementations, which may not be in the order shown or discussed, including performing functions in a substantially simultaneous manner or in a reverse order according to the functions involved.

It should be understood that each part of the present application may be implemented by hardware, software, firmware or a combination thereof. In the above embodiments, a plurality of steps or methods may be implemented by software or firmware stored in a memory and executed by a suitable instruction execution system. For example, the hardware implementation may be any one or a combination of the following technologies known in the art: discrete logic circuits with logic gates for implementing logic functions on data signals, and application specific integrated circuits with suitable combinational logic gates, programmable gate array (PGA), field programmable gate array (FPGA), etc.

Those skilled in the art may understand that all or part of the steps in the methods of the foregoing embodiments may be implemented by a program instructing relevant hardware. The program may be stored in a computer-readable storage medium and when being executed, executes one of the steps of the method embodiment or a combination thereof.

In addition, the functional units in each embodiment of the present application may be integrated into one processing module, or each unit may exist alone physically, or two or more units may be integrated into one module. The above-mentioned integrated modules may be implemented either in the form of hardware or in the form of software functional modules. If the integrated module is implemented in the form of a software function module and sold or used as an independent product, it may also be stored in a computer readable storage medium.

The above-mentioned storage medium may be a read-only memory, a magnetic disk or an optical disk, etc.

In the description, the terms "one embodiment", "some embodiments", "examples", "specific examples", or "some examples" and other descriptions mean specific features, structures, materials or characteristics described in conjunction with the embodiment or example are included in at least one embodiment or example of the present application. In the description, the schematic representations of the above-mentioned terms do not necessarily refer to the same embodiment or example. Moreover, the described specific features, structures, materials or characteristics may be combined in any one or more embodiments or examples in a suitable manner.

Although the embodiments of the present application have been shown and described, the above-mentioned embodiments are exemplary and should not be construed as limiting the present application. Those skilled in the art may make changes, modifications, substitutions and modifications to the above-mentioned embodiments within the scope of the present application.

What is claimed is:

1. A method for detecting welding spot quality abnormalities based on deep learning, wherein the detection of the abnormalities includes all the welding spots of an object without manually checking, comprising:
    acquiring an actual dynamic welding parameter including a welding current, a welding voltage, resistance and power from a welding controller in a welding process corresponding to a target welding spot as an input parameter;
    inputting the input parameter into a pre-trained dynamic welding parameter simulation model for simulation, and acquiring a simulation result of the dynamic welding parameter output by the pre-trained dynamic welding parameter simulation model as an output parameter, wherein the pre-trained dynamic welding parameter simulation model is trained in real-time using actual dynamic welding parameters of welding spots as training samples with a training target of minimizing the difference between input and output; and
    determining a deviation of the input parameter from the output parameter, and when the deviation is greater than a preset threshold, determining that the target welding spot is an abnormal welding spot;
    wherein for any set of training samples, inputting the training samples into the pre-trained dynamic welding parameter simulation model for simulation, and acquiring simulation sample data output by the pre-trained dynamic welding parameter simulation model; and adjusting model parameters of the pre-trained dynamic welding parameter simulation model based on the deviation of the input parameter from the output parameter from the training sample, so as to realize updating and training of the pre-trained dynamic welding parameter simulation model for all the welding spots of the object.

2. The method according to claim 1, wherein the pre-trained dynamic welding parameter simulation model is a deep learning auto-encoder model; and
    said step of acquiring the output parameter by simulation comprises:

inputting the input parameter into the deep learning auto-encoder model for reconstruction, and acquiring the output parameter output by the deep learning auto-encoder model.

3. The method according to claim 2, wherein said step of acquiring the output parameter by reconstruction comprises:
inputting the input parameter into an encoder layer of the deep learning auto-encoder model for dimensionality reduction mapping, and acquiring a target dimensionality parameter output by the encoder layer; and
inputting the target dimensionality parameter into a decoder layer of the deep learning auto-encoder model for reconstruction mapping, and acquiring the output parameter output by the decoder layer.

4. The method according to claim 1, wherein the pre-trained dynamic welding parameter simulation model is a sequence-to-sequence model; and
said acquiring the output parameter by simulation comprises:
inputting the input parameter into the sequence-to-sequence model for prediction, and acquiring the output parameter output by the sequence-to-sequence model.

5. The method according to claim 1, wherein said step of acquiring the input parameter in the welding process corresponding to a target welding spot comprises:
when welding the target welding spot, acquiring the input parameter in the welding process at intervals of a preset duration.

6. The method according to claim 1, further comprising:
if the deviation is less than or equal to the preset threshold, storing the acquired input parameter of the target welding spot in a target storage area; and
acquiring stored input parameter from the target storage area, and updating and training the pre-trained dynamic welding parameter simulation model by using the stored input parameter as updated training sample.

7. A non-transitory storage medium storing one or more programs, wherein the one or more programs, when being executed, realize the method as defined in claim 1.

8. A device for detecting welding spot quality abnormalities based on deep learning, wherein the detection of the abnormalities includes all the welding spots of an object without manually checking, comprising a processor, a memory coupled to the processor, and wherein the memory stores executable instructions that, when executed by the processor, cause the processor to realize:
an acquiring module configured to acquire an actual dynamic welding parameter including a welding current, a welding voltage, resistance and power from a welding controller in a welding process corresponding to any a target welding spot as an input parameter;
a simulating module configured to input the input parameter into a pre-trained dynamic welding parameter simulation model for simulation, and acquire a simulation result of the dynamic welding parameter output by the pre-trained dynamic welding parameter simulation model as an output parameter, wherein the pre-trained dynamic welding parameter simulation model is trained in real-time using actual dynamic welding parameters of welding spots as training samples with a training target of minimizing the difference between input and output; and
an abnormality determining module configured to determine a deviation of the input parameter from the output parameter, and when the deviation is greater than a preset threshold, determine that the target welding spot is an abnormal welding spot;
wherein for any set of training samples, inputting the training samples into the pre-trained dynamic welding parameter simulation model for simulation, and acquiring simulation sample data output by the pre-trained dynamic welding parameter simulation model; and adjusting model parameters of the pre-trained dynamic welding parameter simulation model based on the deviation of the input parameter from the output parameter from the training sample, so as to realize updating and training of the pre-trained dynamic welding parameter simulation model for all the welding spots of the object.

* * * * *